(12) United States Patent
Huang et al.

(10) Patent No.: US 11,488,964 B2
(45) Date of Patent: Nov. 1, 2022

(54) METHOD OF MANUFACTURING SEMICONDUCTOR STRUCTURE HAVING WORD LINE DISPOSED OVER PORTION OF AN OXIDE-FREE DIELECTRIC MATERIAL IN THE NON-ACTIVE REGION

(71) Applicant: NANYA TECHNOLOGY CORPORATION, New Taipei (TW)

(72) Inventors: Ching-Chia Huang, Taipei (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/371,119

(22) Filed: Jul. 9, 2021

(65) Prior Publication Data

US 2021/0335794 A1 Oct. 28, 2021

Related U.S. Application Data

(62) Division of application No. 16/799,859, filed on Feb. 25, 2020, now Pat. No. 11,101,273.

(51) Int. Cl.
*H01L 29/423* (2006.01)
*H01L 27/108* (2006.01)

(52) U.S. Cl.
CPC .. *H01L 27/10876* (2013.01); *H01L 27/10823* (2013.01); *H01L 27/10891* (2013.01)

(58) Field of Classification Search
CPC ......... H01L 29/42336; H01L 29/42356; H01L 29/66704; H01L 29/66734
USPC .................................................. 438/259, 270
See application file for complete search history.

(56) References Cited

U.S. PATENT DOCUMENTS

2011/0260242 A1 10/2011 Jang
2015/0380543 A1* 12/2015 Zink ................... H01L 27/0922
257/334

OTHER PUBLICATIONS

Meiyue Zhang et al., "Reactive Ion Etching Selectivity of Si/SiO2:Comparing of two fluorocarbon gases CHF3 and CF4", posted at (ScholarlyCommons: https://repository.upenn.edu/scn_protocols/55), Published by Singh Center for Nanotechlogy of University of Pennsylvania, Mar. 1, 2019.

* cited by examiner

*Primary Examiner* — Hoai V Pham
(74) *Attorney, Agent, or Firm* — CKC & Partners Co., LLC (57) ABSTRACT

A method of manufacturing a semiconductor structure includes: receiving a substrate having an active region and a non-active region adjacent to the active region; forming an etch stop layer over the non-active region of the substrate, in which the etch stop layer is oxide-free; forming an isolation over the etch stop layer; removing a portion of the active region and a portion of the isolation to form a first trench in the active region and a second trench over the etch stop layer, respectively, in which a thickness of the etch stop layer beneath the second trench is greater than a depth difference between the first trench and the second trench; forming a dielectric layer in the first trench; and filling a conductive material on the dielectric layer in the first trench and in the second trench. A semiconductor structure is also provided.

20 Claims, 7 Drawing Sheets

METHOD OF MANUFACTURING SEMICONDUCTOR STRUCTURE HAVING WORD LINE DISPOSED OVER PORTION OF AN OXIDE-FREE DIELECTRIC MATERIAL IN THE NON-ACTIVE REGION

CROSS-REFERENCE TO RELATED APPLICATION

This application is a Divisional Application of the U.S. application Ser. No. 16/799,859, filed on Feb. 25, 2020, the entirety of which is incorporated by reference herein in their entireties.

BACKGROUND

Field of Invention

The present disclosure relates to a method of manufacturing a semiconductor structure and a semiconductor structure.

Description of Related Art

Electrical products are becoming lighter, thinner, shorter, and smaller, and DRAMs are being scaled down to match the trends of high integration and high density. A DRAM including many memory cells is one of the most popular volatile memory devices utilized today. Each memory cell includes a transistor and at least a capacitor, wherein the transistor and the capacitor form a series connection with each other. The memory cells are arranged into memory arrays. The memory cells are addressed via a word line and a digit line (or bit line), and one of which addresses a column of memory cells while the other addresses a row of memory cells. By using the word line and the digit line, a DRAM cell can be read and programmed.

Further, as semiconductor fabrication technology continues to improve, sizes of electronic devices are reduced, and the size of memory cells decreases correspondingly. Disturbance of the word line due to decrease of the space between the word lines becomes a serious issue in a memory device.

SUMMARY

The present disclosure provides a method of manufacturing a semiconductor structure, which includes: receiving a substrate having an active region and a non-active region adjacent to the active region; forming an etch stop layer over the non-active region of the substrate, in which the etch stop layer is oxide-free; forming an isolation over the etch stop layer; removing a portion of the active region and a portion of the isolation to form a first trench in the active region and a second trench over the etch stop layer, respectively, in which a thickness of the etch stop layer beneath the second trench is greater than a depth difference between the first trench and the second trench; and forming a dielectric layer in the first trench; and filling a conductive material on the dielectric layer in the first trench and in the second trench.

In some embodiments, the etch stop layer includes nitride, carbon or a combination thereof.

In some embodiments, forming the dielectric layer in the first trench further includes forming the dielectric layer in the second trench.

In some embodiments, the method further includes forming a pad oxide layer over the non-active region of the substrate before forming the etch stop layer.

The present disclosure also provides a semiconductor structure, which includes a substrate, a buried gate electrode, a gate dielectric layer, an oxide-free dielectric material and a word line. The substrate has an active region and a non-active region adjacent to the active region, in which the active region has a first trench. The buried gate electrode is disposed in the first trench. The gate dielectric layer is interposed between the buried gate electrode and the first trench. The oxide-free dielectric material is disposed over the non-active region of the substrate. The word line is disposed over a portion of the oxide-free dielectric material, in which a thickness of the oxide-free dielectric material beneath the word line is greater than a depth difference between the buried gate electrode and the word line.

In some embodiments, the semiconductor structure further includes an isolation disposed over another portion of the oxide-free dielectric material and laterally adjacent to the word line.

In some embodiments, the oxide-free dielectric material includes nitride, carbon or a combination thereof.

In some embodiments, the gate dielectric layer is further interposed between the oxide-free dielectric material and the word line.

In some embodiments, the semiconductor structure further includes a pad oxide layer interposed between the substrate and the oxide-free dielectric material.

In some embodiments, the pad oxide layer is further interposed between the substrate and the word line.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIGS. 1A-6A are top views of a method of manufacturing a semiconductor structure in various stages in accordance with some embodiments of the present disclosure.

FIGS. 1B-6B are cross-sectional views taken along line B-B' of FIGS. 1A-6A, respectively, in accordance with some embodiments of the present disclosure.

DETAILED DESCRIPTION

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "below," "over," "on," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" or "below" to "over" or "on." In addition, the spatially relative descriptions used herein should be interpreted the same.

As mentioned above, disturbance of the word line due to decrease of the space between the word lines becomes a serious issue in a memory device. The inventors found that the disturbance of the word line comes from barrier lowering effect (e.g., sub-threshold voltage lowering) because of the adjacent word line write/read. The inventors further found that the deeper the adjacent word line on the non-active region of the substrate, the greater the disturbance of the word line in the active region of the substrate. Therefore, the present disclosure provides a method of manufacturing the semiconductor structure having a word line with a shallower depth to solve the issue mentioned above. Embodiments of the method of manufacturing the semiconductor structure will be described in detail below.

FIGS. 1A-6A are top views of a method of manufacturing a semiconductor structure in various stages in accordance with some embodiments of the present disclosure. FIGS. 1B-6B are cross-sectional views taken along line B-B' of FIGS. 1A-6A, respectively, in accordance with some embodiments of the present disclosure.

Figure 1A:
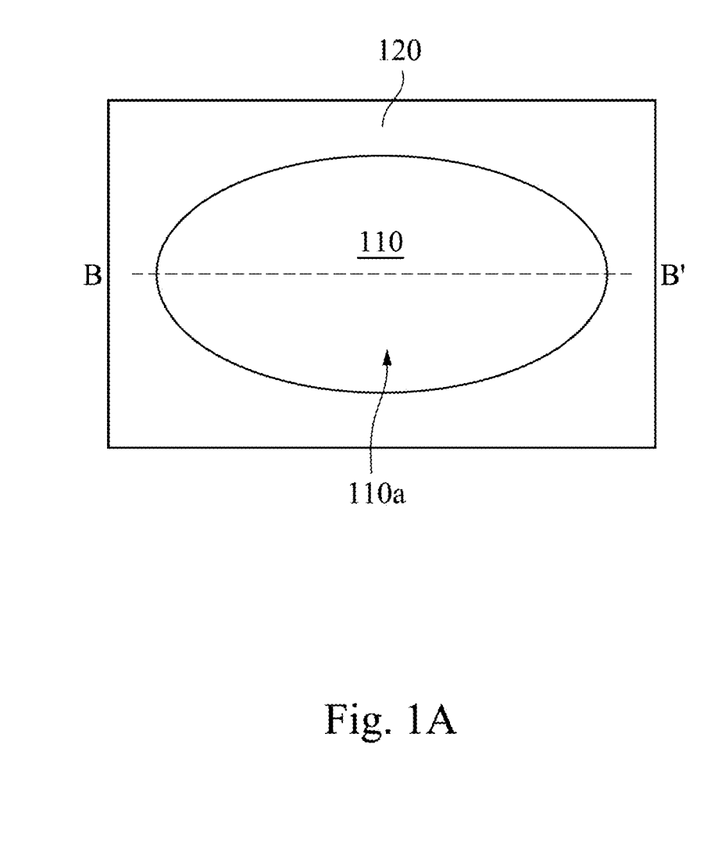
Figure 1B:
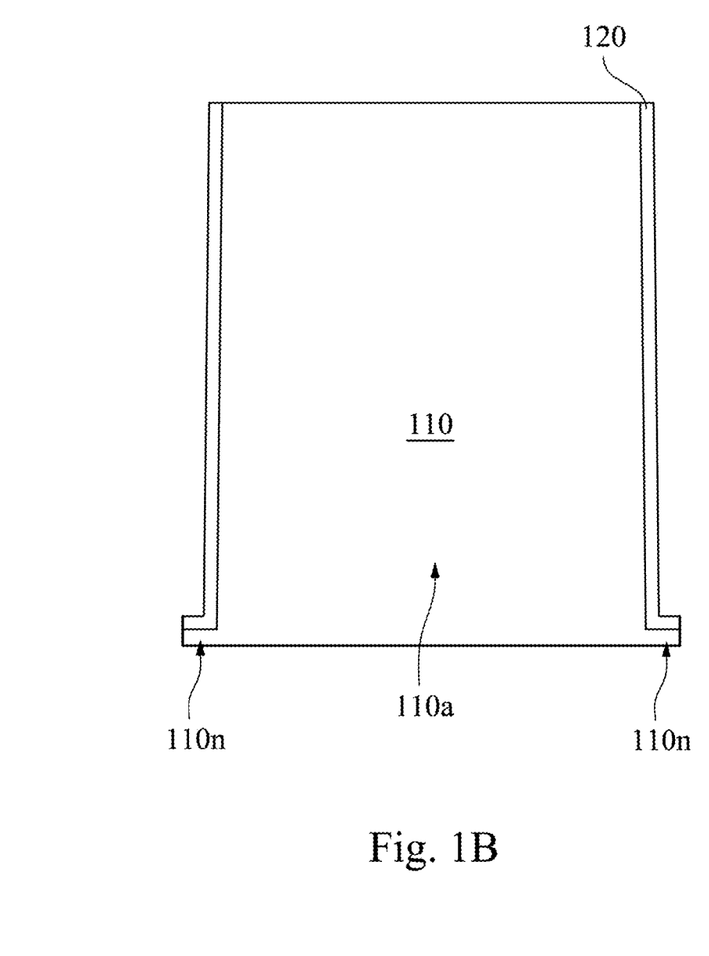
Figure 2A:
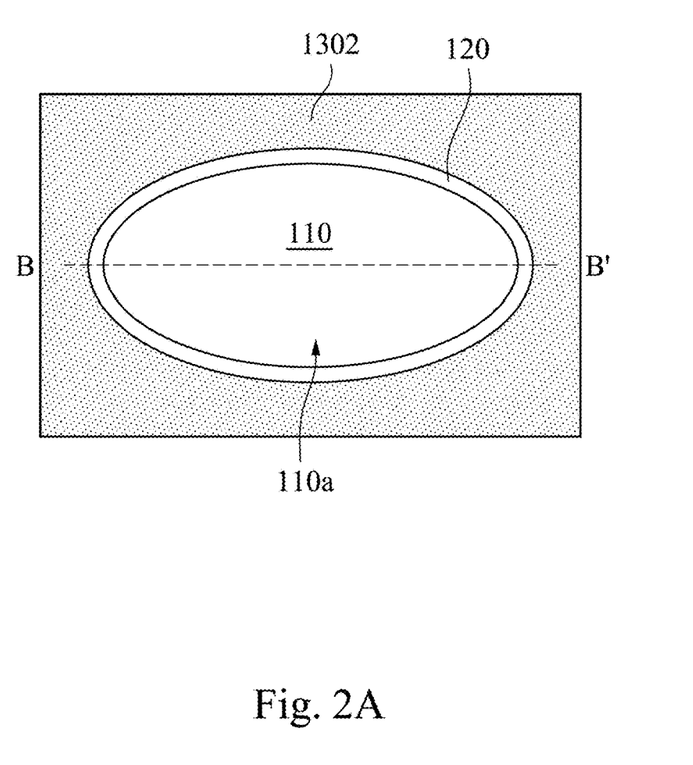
Figure 2B:
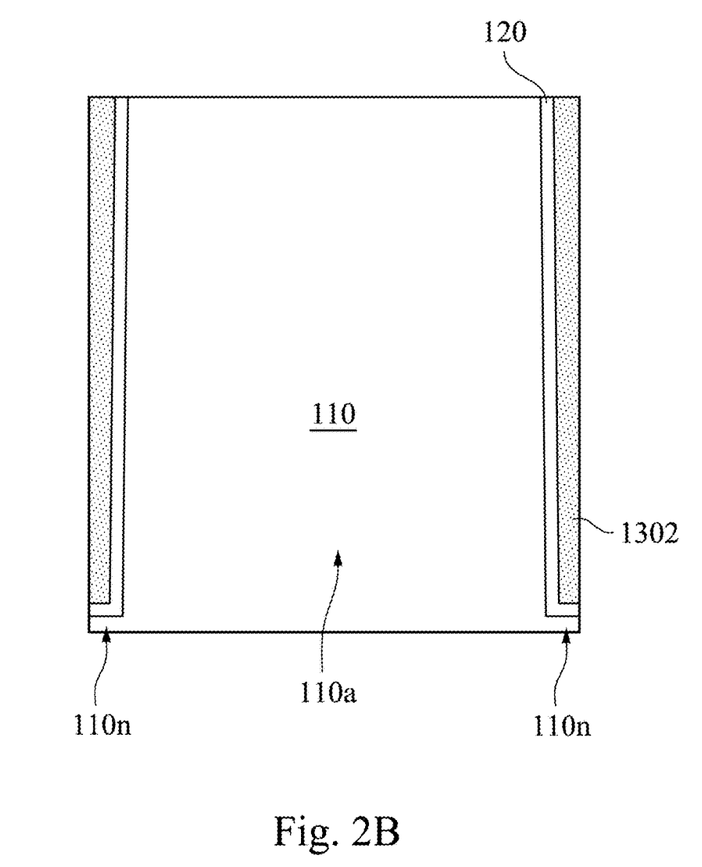

As shown in FIGS. 1A and 1B, a substrate 110 having an active region 110a and a non-active region 110n adjacent to the active region 110a is received. In some embodiments, a bulk substrate is received and then patterned to form the substrate 110 having the active region 110a and the non-active region 110n. In some embodiments, the bulk substrate is a bulk silicon substrate. In some embodiments, the substrate 110 is formed using photolithography and etching processes. In some embodiments, the substrate 110 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof.

In some embodiments, a pad oxide layer 120 is formed over the non-active region 110n of the substrate 110, as shown in FIGS. 1A-1B. In some embodiments, the pad oxide layer 120 is also formed on a sidewall of the active region 110a. In some embodiments, the pad oxide layer 120 is conformally formed. In some embodiments, the pad oxide layer 120 is formed using thermal oxidation, chemical vapor deposition (CVD) or other suitable processes.

Figure 3A:
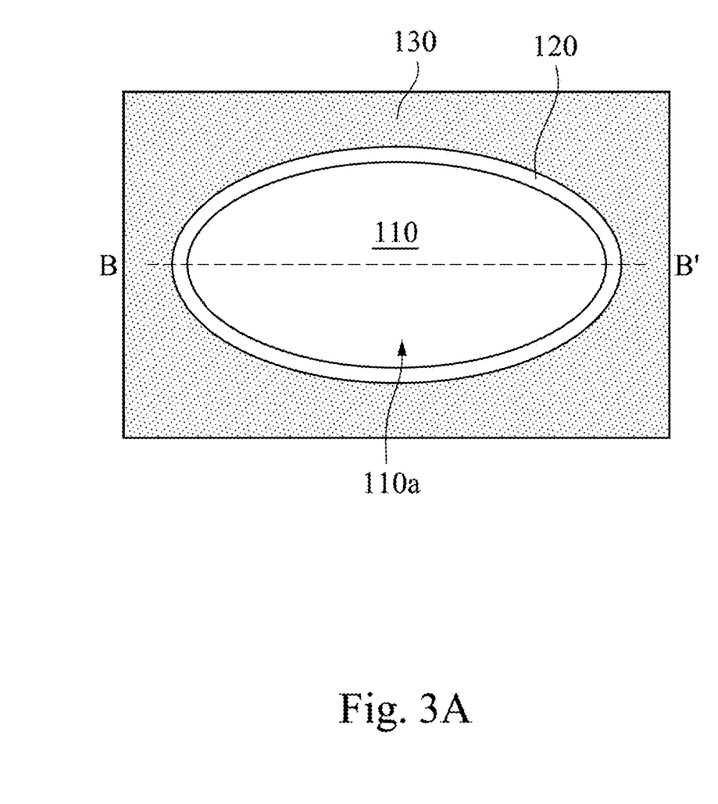
Figure 3B:
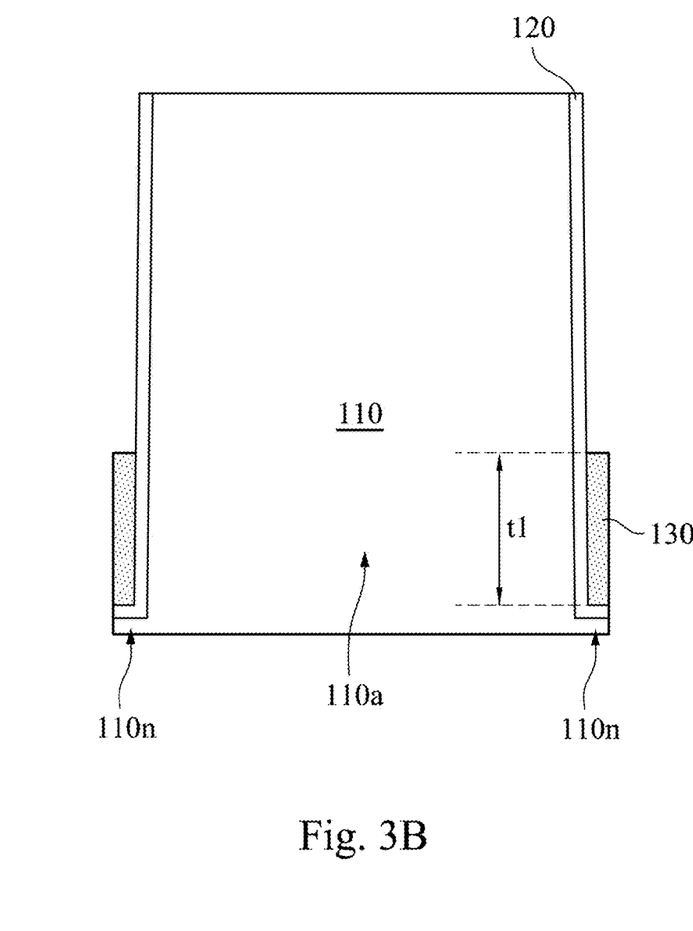
Figure 4A:
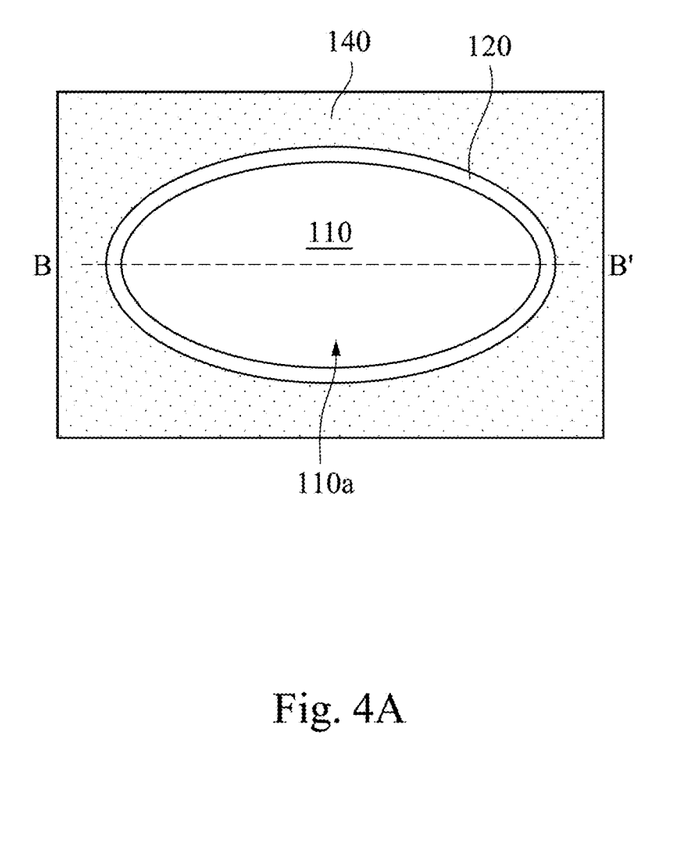
Figure 4B:
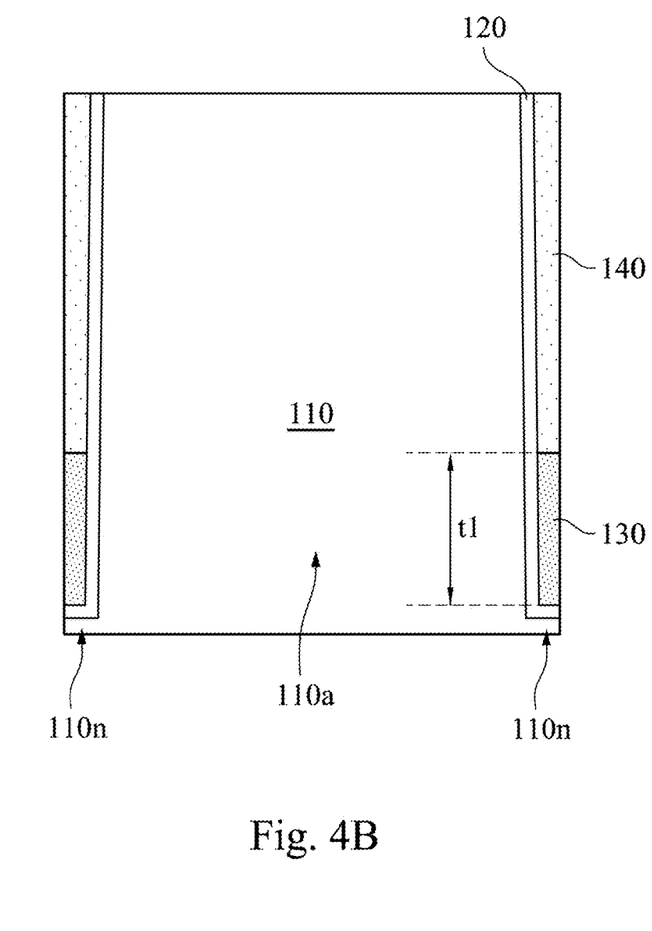

Subsequently, as shown in FIGS. 2A-2B and 3A-3B, an etch stop layer 130 is formed over the non-active region 110n of the substrate 110, in which the etch stop layer 130 is oxide-free. In some embodiments, the etch stop layer 130 includes nitride, carbon or a combination thereof, such as silicon nitride and silicon carbon nitride. In some embodiments, as shown in FIGS. 2A-2B and 3A-3B, an etch stop material 1302 is formed over the non-active region 110n of the substrate 110, and then etched back to form the etch stop layer 130. In some embodiments, the etch stop material 1302 is formed using CVD or other suitable processes. In some embodiments, as shown in FIG. 3B, the etch stop layer 130 has a sufficient thickness t1, and thus a depth of a word line subsequently formed over the etch stop layer 130 will be not very deep.

Next, as shown in FIGS. 3A-3B and 4A-4B, an isolation 140 is formed over the etch stop layer 130 over the non-active region 110n of the substrate 110. The isolation 140 may also be called as shallow trench isolation (STI). In some embodiments, the isolation 140 is formed using CVD or other suitable processes. In some embodiments, the isolation 140 includes oxide.

Figure 5A:
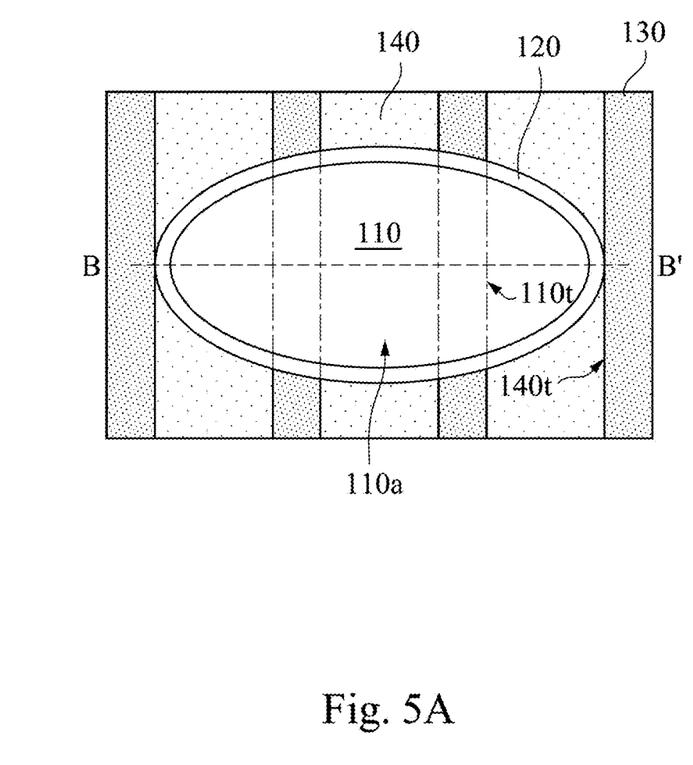
Figure 5B:
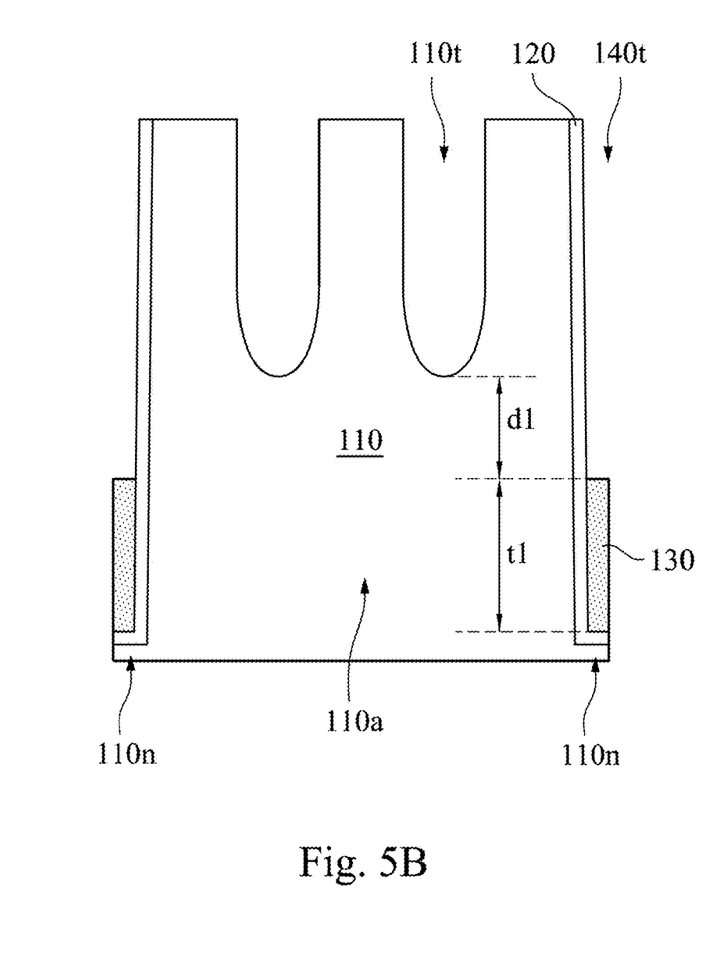

Subsequently, as shown in FIGS. 4A-4B and 5A-5B, a portion of the active region 110a and a portion of the isolation 140 are removed to form a first trench 110t in the active region 110a and a second trench 140t over the etch stop layer 130, respectively. In some embodiments, the portion of the isolation 140 is fully removed to form the second trench 140t exposing the etch stop layer 130, as shown in FIG. 5B. In some embodiments, the portion of the active region 110a and the portion of the isolation 140 are removed using an anisotropic etching process, such as a dry etching process (e.g., a reactive ion etching (RIE) process) or other suitable processes. In some embodiments, fluorine-based gases (e.g., fluorocarbon gases, such as $CF_4$ and $CHF_3$) are used in the dry etching process, and hydrogen and/or oxygen may be optionally added during the dry etching process.

It is noted that the thickness t1 of the etch stop layer 130 beneath the second trench 140t is greater than a depth difference d1 between the first trench 110t and the second trench 140t, as shown in FIG. 5B. Therefore, the word line subsequently formed over the etch stop layer 130 over the non-active region 110n is not very deep, and thus the word line over the etch stop layer 130 over the non-active region 110n during write/read will not disturb a word line subsequently formed in the active region 110a.

Next, as shown in FIGS. 5A-5B and 6A-6B, a dielectric layer 150 is formed in the first trench 110t, and a conductive material 160 is then filled on the dielectric layer 150 in the first trench 110t and in the second trench 140t. In some embodiments, the dielectric layer 150 is further formed in the second trench 140t. In some embodiments, the dielectric layer 150 in the first trench 110t is thicker than the dielectric layer 150 in the second trench 140t.

Figure 6A:
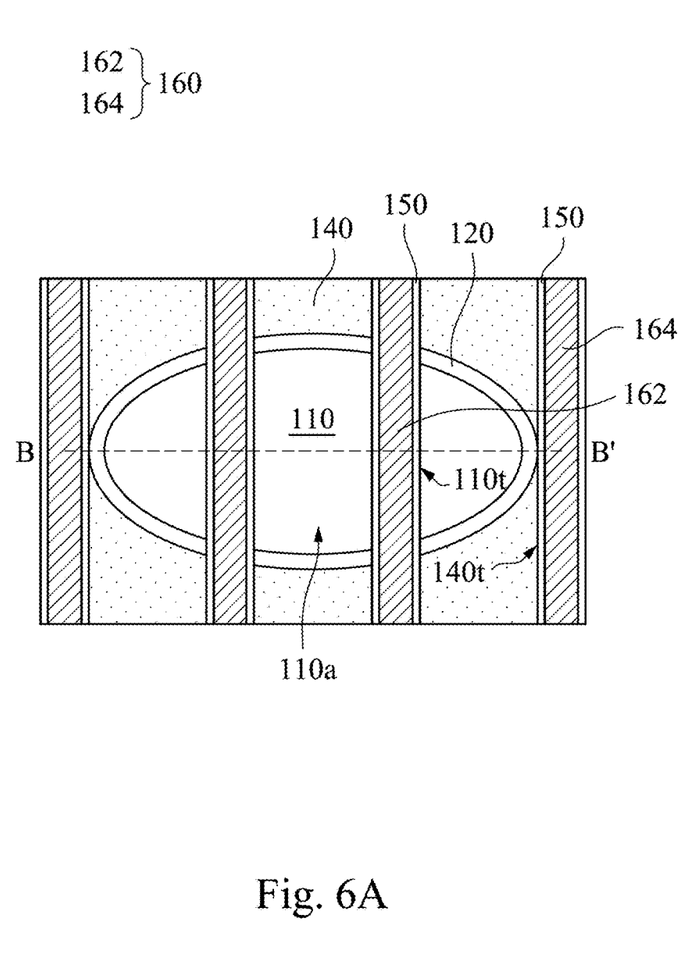
Figure 6B:
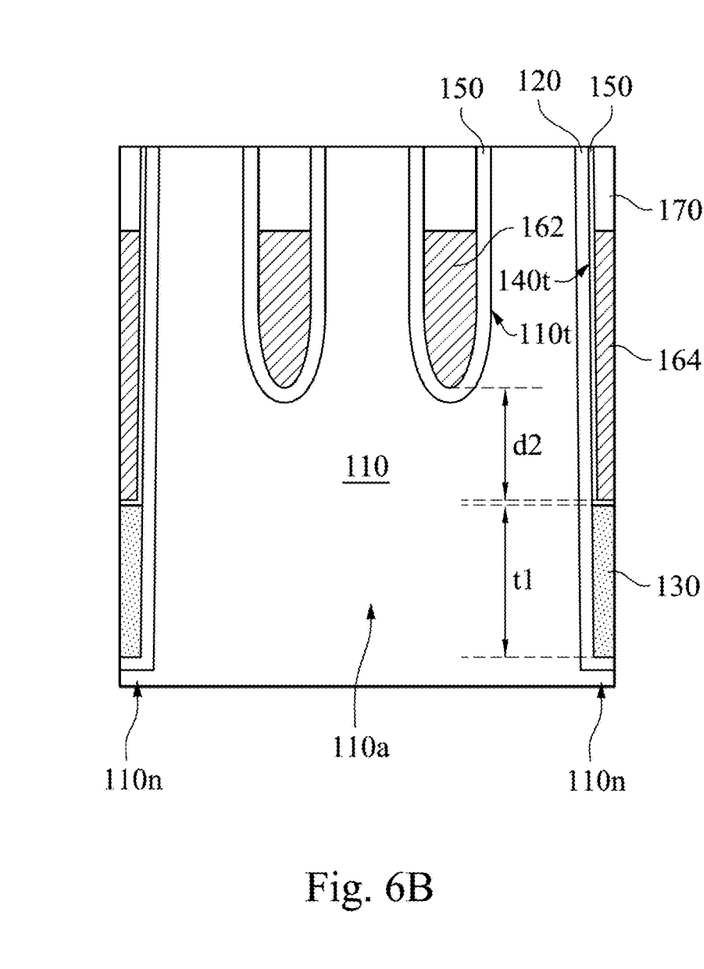

In some embodiments, the dielectric layer 150 includes silicon oxide, silicon nitride, silicon oxynitride, any other suitable dielectric material or a combination thereof. In some embodiments, the dielectric layer 150 is formed using thermal oxidation, CVD or other suitable processes.

In some embodiments, the conductive material 160 includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some embodiments, the conductive material 160 is formed using sputtering, physical vapor deposition (PVD), CVD, atomic layer deposition (ALD), any other suitable formation technique or a combination thereof. In some embodiments, the conductive material is deposited protruding a top surface of the substrate (not shown), and a polishing process (e.g., chemical mechanical polishing (CMP)) and an etching back process are then performed to form a buried gate electrode 162 and a word line 164. It is noted that since the word line 164 is not very deep, the word line 164 during write/read will not disturb the buried gate electrode 162.

Subsequently, as shown in FIGS. 6A-6B, a capping layer 170 is formed over the conductive material 160 (including the buried gate electrode 162 and the word line 164). In some embodiments, the capping layer 170 includes oxide, nitride, oxynitride or other suitable materials. In some embodiments, the capping layer 170 is formed using CVD such as low pressure CVD (LPCVD) and plasma enhanced CVD (PECVD).

The present disclosure also provides a semiconductor structure having a word line with a shallower depth. FIGS. 6A-6B are respectively a top view and a cross-sectional view of a semiconductor structure in accordance with some embodiments of the present disclosure. As shown in FIGS. 6A-6B, the semiconductor structure includes a substrate 110, a buried gate electrode 162, a gate dielectric layer 150, an oxide-free dielectric material 130 and a word line 164.

The substrate 110 has an active region 110a and a non-active region 110n adjacent to the active region 110a, in which the active region 110a has a first trench 110t. In some embodiments, the non-active region 110n surrounds the active region 110a, and the active region 110a is island-shaped, as shown in FIGS. 6A-6B. In some embodiments, the active region 110a has a height higher than a height of the non-active region 110n, as shown in FIG. 6B. In some embodiments, the substrate 110 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof.

The buried gate electrode 162 is disposed in the first trench 110t. In some embodiments, the buried gate electrode 162 includes Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable material or a combination thereof.

The gate dielectric layer 150 is interposed between the buried gate electrode 162 and the first trench 110t. In some embodiments, the gate dielectric layer 150 includes silicon oxide, silicon nitride, silicon oxynitride, any other suitable dielectric material or a combination thereof.

The oxide-free dielectric material 130 is disposed over the non-active region 110n of the substrate 110. In some embodiments, the oxide-free dielectric material 130 includes nitride, carbon or a combination thereof, such as silicon nitride and silicon carbon nitride.

The word line 164 is disposed over the oxide-free dielectric material 130. In some embodiments, the word line 164 includes Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable material or a combination thereof. In some embodiments, the gate dielectric layer 150 is further interposed between the oxide-free dielectric material 130 and the word line 164, as shown in FIG. 6B.

It is noted that a thickness t1 of the oxide-free dielectric material 130 beneath the word line 164 is greater than a depth difference d2 between the buried gate electrode 162 and the word line 164. In other words, the word line 164 on the non-active region 110n is not very deep, and thus the word line 164 during write/read will not disturb the buried gate electrode 162 in the active region 110a.

In some embodiments, the semiconductor structure further includes an isolation 140 disposed over the oxide-free dielectric material 130 and laterally adjacent to the word line 164, as shown in FIG. 6A.

In some embodiments, the semiconductor structure further includes a pad oxide layer 120 interposed between the substrate 110 and the oxide-free dielectric material 130, as shown in FIG. 6B. In some embodiments, the pad oxide layer 120 is also interposed between the substrate 110 and the word line 164, as shown in FIG. 6B.

Figure 7:
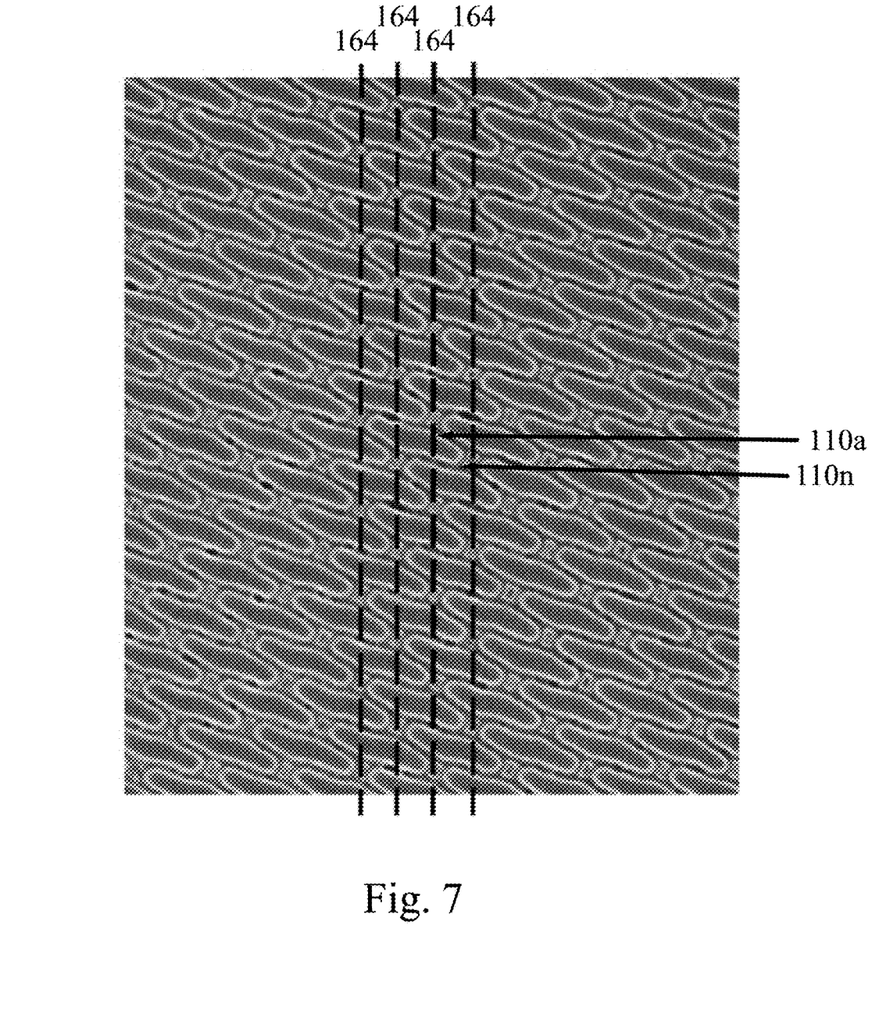
FIG. 7 is a SEM image of a semiconductor structure in accordance with one embodiment of the present disclosure.

FIG. 7 is a SEM image of a semiconductor structure in accordance with one embodiment of the present disclosure. As shown in FIG. 7, there are a plurality of active regions 110a separated from each other, a non-active region 110n, and a plurality of word lines 164 crossing over the active regions 110a and the non-active region 110n. Based on the embodiments of the present disclosure, since the word line 164 on the non-active region 110n is not very deep, the word line 164 on the non-active region 110n during write/read will not disturb the word line 164 in the active region 110a.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A method of manufacturing a semiconductor structure, the method comprising:
   receiving a substrate having an active region and a non-active region adjacent to the active region;
   forming an etch stop layer over the non-active region of the substrate, wherein the etch stop layer is oxide-free;
   forming an isolation over the etch stop layer;
   removing a portion of the active region and a portion of the isolation to form a first trench in the active region and a second trench over the etch stop layer, respectively, wherein a thickness of the etch stop layer beneath the second trench is greater than a depth difference between the first trench and the second trench;
   forming a dielectric layer in the first trench; and
   filling a conductive material on the dielectric layer in the first trench and in the second trench.

2. The method of claim 1, wherein the etch stop layer comprises nitride, carbon or a combination thereof.

3. The method of claim 1, wherein the etch stop layer comprises silicon nitride.

4. The method of claim 1, wherein the etch stop layer comprises silicon carbon nitride.

5. The method of claim 1, wherein forming the dielectric layer in the first trench further comprises forming the dielectric layer in the second trench.

6. The method of claim 5, wherein the dielectric layer in the first trench is thicker than the dielectric layer in the second trench.

7. The method of claim 1, further comprising:
   forming a pad oxide layer over the non-active region of the substrate before forming the etch stop layer.

8. The method of claim 7, wherein forming the etch stop layer comprises forming the etch stop layer in contact with the pad oxide layer.

9. The method of claim 1, wherein forming the etch stop layer comprises:
   forming an etch stop material over the non-active region of the substrate; and
   etching back the etch stop material to form the etch stop layer.

10. The method of claim 1, wherein removing the portion of the isolation to form the second trench over the etch stop layer comprises forming the second trench exposing the etch stop layer.

11. The method of claim 1, wherein removing the portion of the active region and the portion of the isolation is conducted by performing an anisotropic etching process.

12. The method of claim 1, further comprising:
   forming a capping layer over the conductive material.

13. The method of claim 1, wherein the non-active region surrounds the active region, and the active region is island-shaped.

14. The method of claim 1, wherein the active region has a height higher than a height of the non-active region.

15. A method of manufacturing a semiconductor structure, the method comprising:
   receiving a substrate having an active region and a non-active region adjacent to the active region;
   forming an etch stop layer over the non-active region of the substrate, wherein the etch stop layer is oxide-free;
   forming an isolation over the etch stop layer;
   removing a portion of the active region and a portion of the isolation to form a first trench in the active region and a second trench over the etch stop layer, respectively, wherein a thickness of the etch stop layer beneath the second trench is greater than a depth difference between the first trench and the second trench;
   forming a dielectric layer in the first trench; and
   forming a buried gate electrode on the dielectric layer in the first trench; and
   forming a word line in the second trench.

16. The method of claim 15, wherein a thickness of the etch stop layer beneath the word line is greater than a depth difference between the buried gate electrode and the word line.

17. The method of claim 15, wherein the etch stop layer comprises nitride, carbon or a combination thereof.

18. The method of claim 15, wherein forming the dielectric layer in the first trench further comprises forming the dielectric layer in the second trench.

19. The method of claim 15, further comprising:
   forming a pad oxide layer over the non-active region of the substrate before forming the etch stop layer.

20. The method of claim 15, wherein the second trench is deeper than the first trench.

* * * * *